United States Patent [19]

Triplett et al.

[11] 4,372,808

[45] Feb. 8, 1983

[54] PROCESS FOR REMOVING A LIQUID PHASE EPITAXIAL LAYER FROM A WAFER

[75] Inventors: Baylor B. Triplett, La Honda; Carlo Ferrando, Aptos; Guido Galli, Saratoga, all of Calif.

[73] Assignee: Intel Magnetics, Inc., Santa Clara, Calif.

[21] Appl. No.: 360,809

[22] Filed: Mar. 22, 1982

[51] Int. Cl.³ .................. H01L 21/312; B44C 1/22
[52] U.S. Cl. ........................... 156/655; 148/171; 156/662; 252/79.1
[58] Field of Search .......... 156/655, 662, 605, 608, 156/624; 252/79.1; 148/1.5, 171

[56] References Cited

U.S. PATENT DOCUMENTS 3,808,068  4/1974  Johnson et al. ............ 156/628 X
3,891,478  6/1975  Ladany et al. .............. 148/171
4,290,843  9/1981  Korenstein et al. ......... 156/655 X

*Primary Examiner*—William A. Powell
*Attorney, Agent, or Firm*—Blakely, Sokoloff, Taylor & Zafman

[57] ABSTRACT

A process for removing a liquid phase epitaxial layer of material from a wafer substrate is disclosed. An etch melt is provided which is substantially the same as that used to grow the epitaxial layer on the wafer surface. The temperature of the etch melt is adjusted such that it exceeds an equilibrium temperature of the epitaxial layer, and lies below an equilibrium temperature of the substrate, such that the epitaxial layer is etched away without affecting the substrate material. The wafer is immersed and maintained within the melt until the epitaxial layer is removed. The wafer may then be reused without repolishing.

9 Claims, 3 Drawing Figures

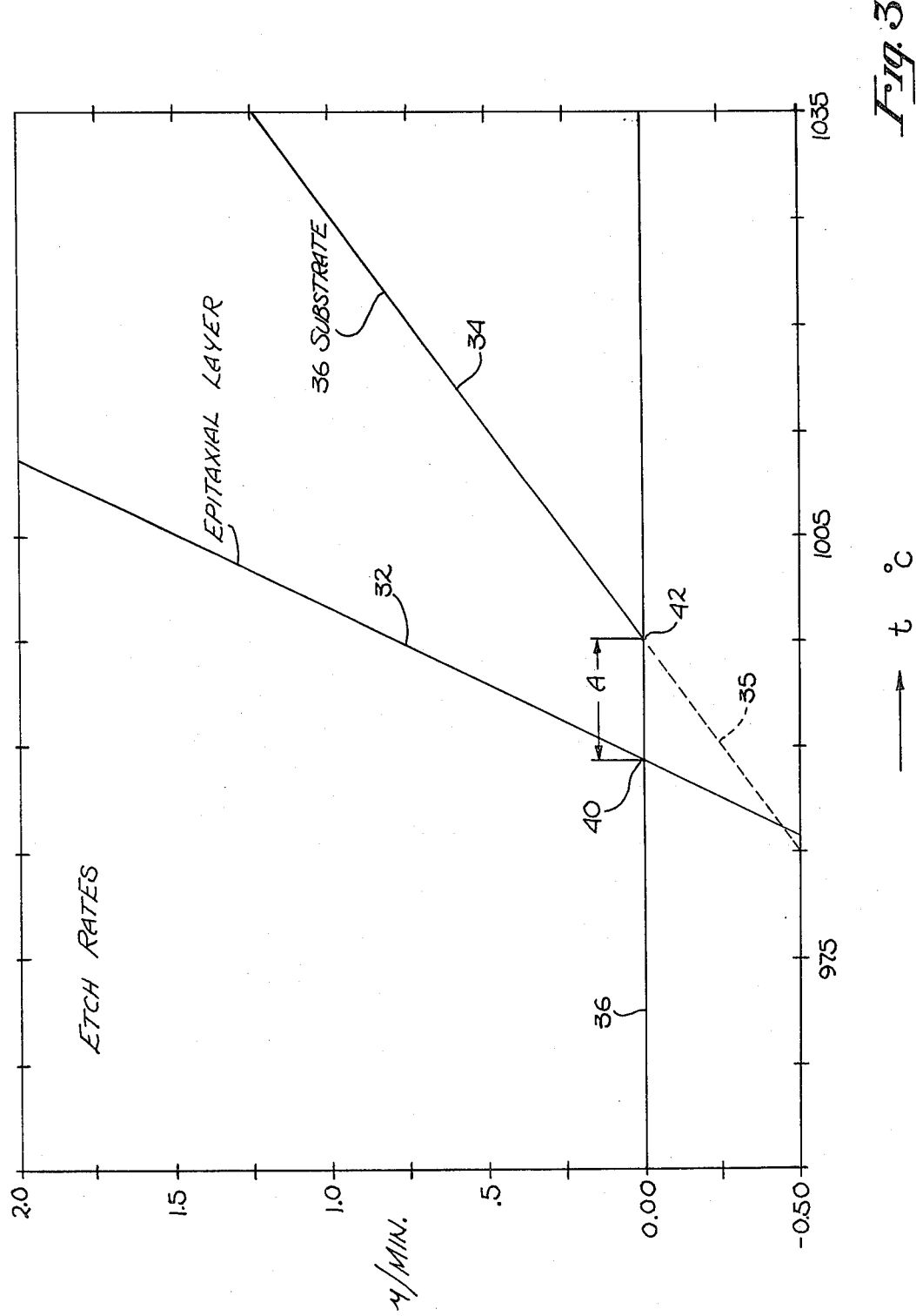

PROCESS FOR REMOVING A LIQUID PHASE EPITAXIAL LAYER FROM A WAFER

BACKGROUND OF THE INVENTION

1. Field of the Invention

This invention relates to the removal of epitaxial layers and, more particularly, to the removal of epitaxial layers from a gadolinium garnet substrate.

2. Art Background

Magnetic bubble devices are frequently used as memories in the computer industry. Of the numerous steps required to produce a finished device, one of the most critical is the growth of an epitaxial layer of magnetic garnet material on an appropriate substrate.

Typically, a non-magnetic substrate is prepared on which the epitaxial layer is deposited. This epitaxial layer is deposited on the non-magnetic substrate in a well known liquid phase epitaxy process (i.e. the epitaxial layer assumes the same crystallographic structure as the substrate). Liquid phase epitaxy is accomplished, in part, by dissolving oxides of the various metal and rare earth ions that are desired in the epitaxial layer in a growth melt (see for example, U.S. Pat. No. 4,190,683).

In practice, a number of difficulties associated with the growth of an epitaxial layer on the substrate have precluded the reduction of the cost of each device. Specifically, the formation of mesas and pits on the epitaxial layer render wafers or portions thereof unuseable. Mesa defects are irregularities in the epitaxial layer which typically project between 2 and 20 microns above the surface of the epitaxial layer. In addition, pitting of the epitaxial layer may occur when lead oxide used in the melt of epitaxial material accidently drips onto the epitaxial layer as it is being withdrawn from the melt solution. The presence of these defects renders the epitaxial layer unusable, since it has been found that these defects may stop bubble movement and/or generate spurious magnetic bubbles thereby introducing errors.

A variety of processes have been devised to lower the incidence of defect formation. For example, one common method is to spin the substrate after it emerges from the growth melt. Additionally, attempts have been made to reduce mesa formation by growing the epitaxial layer with the substrate tilted at an angle (i.e. at 5 degrees). Moreover, other attempts to preclude defect formation include stirring the growth melt before substrate immersion and during the growth process, and combining other methods, such as for example tilting the substrate, to minimize defects. (See for example Giess et al, IMB technical disclosure bulletin, 16(9), 3049 (1974); and U.S. Pat. No. 4,277,519).

Despite attempts to minimize the formation of irregularities such as mesas and pits a certain percentage of bubble wafer area is defective after epitaxial growth. Presently, wafers on which epitaxial defects are discovered are either discarded or repolished. Inasmuch as the wafer constitutes a substantial portion of the overall cost of each bubble device, discarding the entire wafer is wasteful and expensive. In addition, polishing a wafer to remove the epitaxial layer in order to begin the growth process anew is both time consuming and expensive. Accordingly, there exists a need to provide a cost effective means whereby a previously grown epitaxial layer can be removed from a substrate without the necessity of reprocessing or polishing the wafer before a new layer is grown.

SUMMARY OF THE INVENTION

The present invention is most advantageously used in connection with the removal of a magnetic epitaxial layer from a non-magnetic bubble wafer substrate. In the presently preferred embodiment, an etch melt including a predetermined amount of epitaxial material, such as to yield a film having the approximate composition $Y_{1.4}Sm_{.3}Lu_{.5}Ca_{.8}Ge_{.8}Fe_{4.2}O_{12}$, and lead oxide (PbO) is provided. Presently, the etch melt is substantially the same as that used to grow the epitaxial layer on the wafer. In addition, in the preferred embodiment the substrate wafer is comprised of a gadolinium gallium garnet (3G). The temperature of the etch is adjusted such that the melt temperature lies within a predetermined range. The melt temperature is provided such that it exceeds an equilibrium temperature of the epitaxial layer, which is defined as that temperature at which neither growth nor etching of the epitaxial layer takes place. Similarly, the melt temperature is such that it does not exceed the temperature at which etching of the wafer occurs. Thus, the temperature is maintained such that etching of the epitaxial layer occurs without etching the 3G substrate wafer. The wafer is immersed and maintained within the melt until a predetermined amount of the epitaxial layer is etched away. If desired, the entire epitaxial layer may be etched from the substrate wafer such that the 3G substrate may be reused without the necessity of repolishing or processing.

BRIEF DESCRIPTION OF THE DRAWINGS

FIG. 3 is a graph illustrating the etch rate of the epitaxial layer and wafer substrate versus melt temperature.

DETAILED DESCRIPTION OF THE INVENTION

A process for removing a liquid phase epitaxial layer from a substrate is disclosed. In the following description for purposes of explanation, specific numbers, chemical compounds, solutions, temperatures, etch rates, etc., are set forth in order to provide a thorough understanding of the present invention. However, it will be apparent to one skilled in the art that the present invention may be practiced without these specific details. In other instances, well known processes are shown in block diagram form in order not to obscure the present invention unnecessarily.

Figure 1:
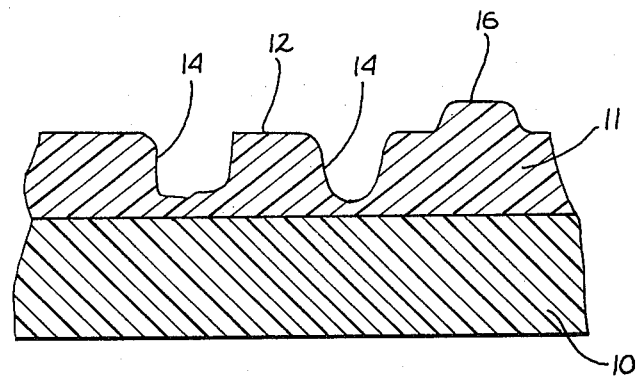
FIG. 1 is a cross sectional view of a wafer illustrating defects and irregularities in the epitaxial layer.

Referring now to FIG. 1, a non-magnetic garnet substrate 10 is provided on which an epitaxial layer 11 is grown. In the presently preferred embodiment, the garnet substrate is cleaned and polished and has a composition represented by the formula $Gd_3Ga_5O_{12}$ (hereinafter the "3G" substrate). The 3G substrate is formed in a conventional manner, typically by slowly rotating a seed having a cubic crystallographic structure in a melt of $Gd_3Ga_5O_{12}$ over along period of time. Inasmuch as the formation of the 3G substrate is well-known in the art, the process will not be set forth further in this description. A magnetic epitaxial layer 11 is formed on the 3G substrate 10 using a well known liquid phase epitaxy process. Liquid phase epitaxy is accomplished, in part, by dissolving oxides of the various metal and rare earth ions desired in a growth melt. For most garnet materials, the composition of the melt which provides a given epitaxial layer is a function of a variety of equilibrium processes. The temperature of the melt is a function of the ratios of the melt composition. As previously discussed, mesas 16 may form on the surface of the grown epitaxial layer 11. In addition, pits 14 may form in the epitaxial layer when solvent compounds, such as PbO, used in dissolving the melt compounds are present on the 3G substrate wafer 10 in liquid form. Despite a variety of methods attempted to preclude the formation of pits, such as shielding and preheating of the 3G substrate, a finite percentage of magnetic bubble wafers processed do show evidence of pitting. Defects such as mesas and pits, as illustrated in FIG. 1, render the magnetic bubble wafer unusable.

An etch melt is provided to remove the epitaxial layer 11 from the 3G substrate 10. In the presently preferred embodiment, the temperature of the original growth melt is adjusted such that etching of the epitaxial layer occurs rather than growth. In practice, the epitaxial layer used in the present invention has a composition represented by the formula $Y_{1.4}Sm_{.3}Lu_{.5}Ca_{.8}Ge_{.8}Fe_{4.2}O_{12}$. In addition, solvent compounds such as PbO and $B_2O_3$ are present in the etch melt as is conventional in the art. Presently, approximately 90% of the etch melt is composed of such solvent compounds. However, it will be appreciated that the particular ratio of the epitaxial material to solvent compounds will vary depending on the nature of the materials and compounds used, for any given application of the present invention.

Figure 2:
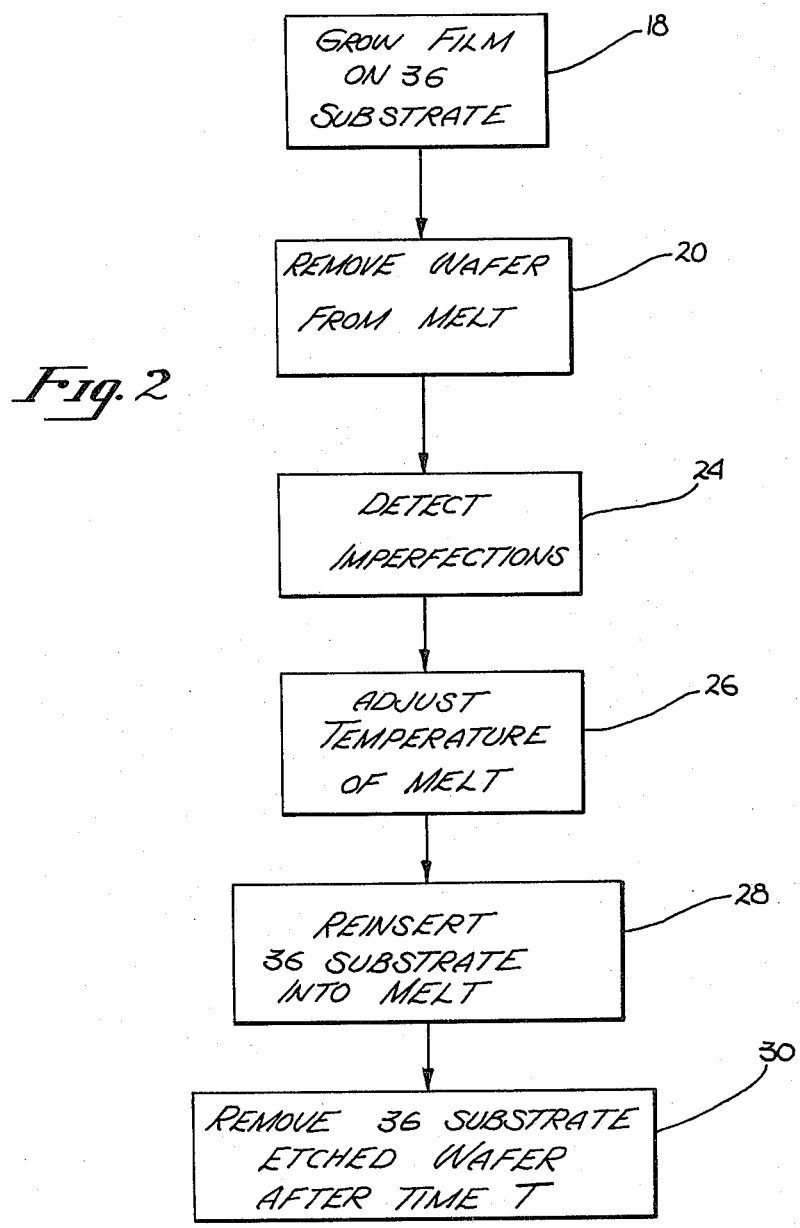
FIG. 2 is a block diagram symbolically illustrating the sequence of steps which are utilized by the present invention.

Referring now to FIG. 2, a block diagram symbolically illustrating the steps of the present invention is disclosed. As previously discussed, an epitaxial layer is grown on the 3G substrate as is conventionally done in the art (18). Sometime after the growth of the layer, the wafer is inspected for imperfections, such as for example mesas and pits (24). If such defects are discovered, the temperature of the original growth melt is adjusted, as will be presently discussed, and the wafer is re-inserted into the melt (28). Due to the aforementioned temperature adjustment, the melt now acts as an etchant and etches the epitaxial layer from the wafer without affecting the 3G substrate. After a predetermined time has elapsed, such that the epitaxial layer has been fully etched away from the 3G substrate, the substrate wafer is removed from the melt (30). The 3G substrate may then be reused and a new epitaxial layer grown thereon, without the necessity of repolishing the wafer.

With reference now to FIG. 3, a graph of etch rate versus melt temperature is disclosed. Temperature in centigrade is represented on the abscissa, and etch-/growth rate in microns per minute is represented on the ordinate. Line 32 illustrates the etch/growth rate of the epitaxial layer on the 3G substrate as a function of the temperature of the melt. Similarly, line 34 represents the rate at which the 3G substrate is etched away as a function of the melt temperature. Line segment 35 is dashed to indicate an imaginary component of the line 34, since in practice no growth of the 3G substrate can occur inasmuch as the melt does not contain 3G substrate material in solution. However, it will be appreciated by one skilled in the art that it is theoretically possible that some growth of the 3G substrate could occur if such material is provided in the melt.

Equilibrium line 36 identifies those points at which neither growth nor etching of the epitaxial layer and substrate takes place. As illustrated in FIG. 3, Line 36 intercepts line 32 at point 40. It will be appreciated that point 40 represents an equilibrium temperature at which neither growth nor etching of the epitaxial layer occurs. Similarly, line 36 intercepts the 3G substrate line 34 at point 42. Point 42 represents the maximum temperature at which the 3G wafer can be maintained without etching the substrate material into the melt. In addition, point 42 also represents a theoretical equilibrium temperature at which neither growth nor etching of the 3G substrate occurs. As previously discussed, at temperatures below point 42 it is possible that 3G substrate growth would exist if substrate material was included in the melt solution.

As will be appreciated from the graph, a range of temperature, designated "A", lies between points 40 and 42. This range represents those temperatures where etching of the epitaxial layer off of the wafer will take place without etching the 3G substrate. In practice, when using a 3G substrate in conjunction with a rare earth epitaxial material, where the melt contains approximately 10% rare earth material and approximately 90% PbO, $B_2O$ oxide solution, it has been found that the temperature range "A" generally corresponds to 970–1,005 degrees centigrade wherein the position of point 40 is generally in the range of 975–990 degrees centigrade, and point 42 is in the range of 990–1005 degrees centigrade. Of course, it will be appreciated that the particular temperature range where etching of the epitaxial layer occurs without affecting the 3G substrate, will vary given the composition of the melt, substrate and epitaxial layer. Thus, the position of the equilibrium points 40 and 42 may be varied by adjusting the relative concentration of epitaxial material in the melt solution. Therefore, the temperature range "A" may be shifted to optimize the eptaxial layer etch rate for the particular apparatus and materials used.

Thus, a method for removing an epitaxial layer from a 3G substrate has been disclosed. The method provides a simple and cost effective means whereby a substrate wafer may be re-used without the necessity of repolishing. While the method has been described with particular emphasis on specific substrate and epitaxial compositions, it will be appreciated that the present invention may be used with a variety of other compounds and solutions used in the art. In addition, it will be noted that although in practice the expitaxial layer is etched away prior to other processing steps, the present invention may be practiced even after these steps have been completed. For example, if a finished bubble memory device or the like is found to be defective, circuit elements as well as the epitaxial layer may be removed using the present invention, and the substrate may then be reused.

It is contemplated that many changes and modifications may be made, by one of ordinary skill in the art, to the materials and arrangements of elements of the invention without departing from the spirit and scope of the invention.

I claim:

1. A process for etching an epitaxial layer of material from a substrate comprising the steps of:
    providing a liquid melt including a predetermined quantity of said epitaxial material within said melt;
    adjusting the temperature of said melt within a predetermined range such that said melt temperature lies above an equilibrium temperature of said epitaxial layer, and below an equilibrium temperature of said substrate, such that said epitaxial layer will be etched off of said substrate at a known rate, said rate being a function of said temperature;

immersing said substrate including said epitaxial layer into said melt;

removing said substrate from said melt once a desired amount of epitaxial material has been etched off of said substrate;

whereby said epitaxial material is removed from said substrate.

2. The process for etching as defined by claim 1 wherein said equilibrium temperature of said epitaxial layer lies within the range of 975 to 990 degrees centigrade.

3. The process for etching as defined by claim 2 wherein said equilibrium temperature of said substrate lies within the range of 990 to 1,005 degrees centigrade.

4. The process for etching as defined by claim 3 wherein said equilibrium temperatures of said epitaxial layer and said substrate may be adjusted by variation of the quantity of said epitaxial material in said melt.

5. The process for etching as defined by claim 3 wherein said substrate comprises a gadolinium gallium garnet and said melt includes epitaxial material of the form $Y_{1.4}Sm_{.3}Lu_{.5}Ca_{.8}Ge_{.8}Fe_{4.2}O_{12}$.

6. A process for removing epitaxial material from a substrate comprising a gadolinium gallium garnet, which comprises the steps of:

providing a liquid melt including a predetermined quantity of said epitaxial material within said melt;

adjusting the temperature of said melt such that said melt temperature lies above an equilibrium temperature of said epitaxial layer, said equilibrium temperature being that temperature at which said epitaxial material is neither deposited on nor disassociated from said substrate;

said melt temperature being further adjusted such that said melt temperature lies below the etch temperature of said substrate, said etch temperature being that temperature at which said substrate begins to disassociate into said melt;

immersing said substrate having a layer of said epitaxial material into said melt;

removing said substrate for said melt once a desired amount of said epitaxial material is removed from said substrate;

whereby said epitaxial material is removed from said substrate without substantially affecting the crystallographic structure of said substrate.

7. The process as defined by claim 6 wherein said melt temperature is adjusted generally within the range of 975 to 1005 degrees centigrade.

8. The process as defined by claim 7 wherein said epitaxial material includes $Y_{1.4}Sm_{.3}Lu_{.5}Ca_{.8}Ge_{.8}Fe_{4.2}O_{12}$.

9. The process as defined by claim 7 wherein said equilibrium and etch temperatures may be adjusted by variation of the quantity of said epitaxial material in said melt.

* * * * *

UNITED STATES PATENT AND TRADEMARK OFFICE
CERTIFICATE OF CORRECTION

PATENT NO. : 4,372,808
DATED : February 8, 1983
INVENTOR(S) : TRIPLETT BAYLOR

It is certified that error appears in the above-identified patent and that said Letters Patent are hereby corrected as shown below:

| COLUMN | LINE | |
|---|---|---|
| 1 | 10 | "gadolinium garnet" should be --gadolinium gallium garnet-- |
| 1 | 54 | "IMB" should be --IBM-- |

Signed and Sealed this

Twenty-fourth Day of July 1984

[SEAL]

Attest:

GERALD J. MOSSINGHOFF

Attesting Officer    Commissioner of Patents and Trademarks